(12) United States Patent
Henry

(10) Patent No.: US 10,121,823 B2
(45) Date of Patent: Nov. 6, 2018

(54) LIGHT EMITTING DIODE CHIP

(71) Applicant: Oculus VR, LLC, Menlo Park, CA (US)

(72) Inventor: Bill Henry, Dublin (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/884,250

(22) Filed: Jan. 30, 2018

(65) Prior Publication Data

US 2018/0158866 A1 Jun. 7, 2018

Related U.S. Application Data

(63) Continuation of application No. 15/267,080, filed on Sep. 15, 2016, now Pat. No. 9,917,136, which is a (Continued)

(51) Int. Cl.
*H01L 25/00* (2006.01)
*H01L 25/075* (2006.01)
(Continued)

(52) U.S. Cl.
CPC .............. *H01L 27/156* (2013.01); *B41J 2/45* (2013.01); *H01L 25/0753* (2013.01);
(Continued)

(58) Field of Classification Search
CPC ... H01L 25/0753; H01L 25/50; H01L 27/153; H01L 27/156; H01L 27/326; H01L 33/20; H01L 33/62; H01L 2224/48137
See application file for complete search history.

(56) References Cited

U.S. PATENT DOCUMENTS 4,728,999 A * 3/1988 Dannatt ................ B41J 2/45
257/88
4,729,999 A 3/1988 Young
(Continued)

FOREIGN PATENT DOCUMENTS

WO WO 90/04853 5/1990
WO WO 2010/130051 A1 11/2010

OTHER PUBLICATIONS

International Search Report and Written Opinion for related International Application No. PCT/EP2013/052690, dated May 27, 2013.
(Continued)

*Primary Examiner* — Marvin Payen
*Assistant Examiner* — Jeremy Joy
(74) *Attorney, Agent, or Firm* — Fenwick & West LLP

(57) ABSTRACT

An LED chip for use in an LED chip array forming a continuous array of LEDs. The LED chip comprises an array of LEDs on a substrate. LEDs in a row of the array are longitudinally offset from corresponding LEDs in another row. Adjacent LEDs in each row of the array are separated by a longitudinal pitch. At least part of an end face of the substrate is angled with respect to a transverse axis of the LED chip such that the LED chip is positionable adjacent another LED chip to maintain the longitudinal pitch between adjacent LEDs on different chips.

20 Claims, 5 Drawing Sheets

Related U.S. Application Data continuation of application No. 14/377,731, filed as application No. PCT/EP2013/052690 on Feb. 11, 2013, now Pat. No. 9,472,594.

(60) Provisional application No. 61/597,236, filed on Feb. 10, 2012.

(51) Int. Cl.
  *H01L 27/15* (2006.01)
  *H01L 27/32* (2006.01)
  *H01L 33/20* (2010.01)
  *H01L 33/62* (2010.01)
  *B41J 2/45* (2006.01)

(52) U.S. Cl.
  CPC ............ *H01L 25/50* (2013.01); *H01L 27/153* (2013.01); *H01L 27/3202* (2013.01); *H01L 27/3204* (2013.01); *H01L 27/326* (2013.01); *H01L 27/3265* (2013.01); *H01L 33/20* (2013.01); *H01L 33/62* (2013.01); *B41J 2202/50* (2013.01); *H01L 2924/0002* (2013.01); *H01L 2924/12041* (2013.01); *H01L 2933/0033* (2013.01)

(56) References Cited

U.S. PATENT DOCUMENTS

| | | | |
|---|---|---|---|
| 5,990,494 A * | 11/1999 | Seko | B41J 2/45 257/81 |
| 6,163,036 A * | 12/2000 | Taninaka | H01L 25/0753 257/88 |
| 6,380,962 B1 | 4/2002 | Miyazaki | |
| 6,410,940 B1 | 6/2002 | Jiang et al. | |
| 6,410,942 B1 * | 6/2002 | Thibeault | H01L 33/08 257/88 |
| 6,450,664 B1 | 9/2002 | Kelly | |
| 6,515,309 B1 | 2/2003 | Tohyama et al. | |
| 6,683,421 B1 | 1/2004 | Kennedy et al. | |
| 7,175,712 B2 * | 2/2007 | Siegel | B41F 23/0409 118/620 |
| 7,518,149 B2 | 4/2009 | Maaskant et al. | |
| 8,937,323 B2 * | 1/2015 | Miyachi | H01L 27/153 257/88 |
| 9,172,012 B2 * | 10/2015 | Andrews | H01L 25/0753 |
| 9,559,250 B2 * | 1/2017 | Bonar | H01L 33/405 |
| 9,695,992 B2 * | 7/2017 | Schadt | G02B 3/005 |
| 9,755,126 B2 * | 9/2017 | Yokokawa | H01L 33/62 |
| 2005/0151828 A1 * | 7/2005 | Maeda | B41J 2/451 347/238 |
| 2005/0199885 A1 * | 9/2005 | Hata | H01L 33/20 257/79 |
| 2006/0113638 A1 * | 6/2006 | Maaskant | H01L 31/035281 257/623 |
| 2006/0166391 A1 * | 7/2006 | Nemoto | B82Y 20/00 438/35 |
| 2008/0198592 A1 * | 8/2008 | Sekiguchi | B41J 2/45 362/227 |

OTHER PUBLICATIONS

United States Office Action, U.S. Appl. No. 14/377,731, dated Sep. 29, 2015, 8 pages.
United States Office Action, U.S. Appl. No. 15/267,080, dated Apr. 10, 2017, 11 pages.
European Examination Report, European Application No. 13705746.9, dated Feb. 22, 2018, 5 pages.

* cited by examiner

LIGHT EMITTING DIODE CHIP

CROSS REFERENCE TO RELATED APPLICATIONS

This application is a continuation of U.S. application Ser. No. 15/267,080, filed Sep. 15, 2016, which is a continuation of U.S. application Ser. No. 14/377,731, filed Aug. 8, 2014, now U.S. Pat. No. 9,472,594, which is a National Phase Application filed under 35 U.S.C. § 371 of International Application No. PCT/EP2013/052690, filed on Feb. 11, 2013, which claims the benefit and priority from U.S. Provisional Patent Application No. 61/597,236, filed on Feb. 10, 2012, the disclosures of which are incorporated herein by reference in their entirety.

TECHNICAL FIELD

The present disclosure relates to a light emitting diode (LED) chip and a method of manufacturing an LED chip. More specifically, the present disclosure relates to, but is not limited to, LED chips and methods of manufacturing LED chips that may be placed adjacent one another to form continuous arrays of LEDs.

BACKGROUND

LEDs are a form of semiconductor material that convert electrical energy into optical energy. In semiconductor LEDs, light is typically generated through recombination of electrons, originating from an n-type doped semiconductor layer, and holes originating from a p-type doped semiconductor layer. In some infra-red emitting semiconductor materials light can be generated by electron intersub-band transitions rather than electron hole transitions.

A major challenge in the field is to extract as much of the emitted light as possible from the semiconductor material into the surrounding medium, usually air. This is hindered by total internal reflection at the surfaces of the semiconductor.

On traditional cuboid shaped LED chips, the average path length for light rays within the semiconductor is long, and the average number of reflections of an emitted light ray at semiconductor surfaces is high, prior to escape. Long path lengths and reflections at metal coated semiconductor surfaces may lead to absorption losses.

A number of approaches have been applied to increase the amount of useful light from LEDs. These include the use of external reflecting mirrors and chip shaping. With all approaches there are also some associated drawbacks.

A further approach to achieving high extraction efficiency (EE) and maximum useable light from a chip is to provide an array of "micro-LEDs" (μLEDs), as such devices keep the average path length within the device short. Arrangements are described in U.S. Pat. Nos. 6,410,940 and 6,410,942.

U.S. Pat. No. 7,518,149 describes a μLED that is an integrated diode structure in a mesa, in which the mesa shape and the light-emitting region are chosen for efficiency. A μLED may include, on a substrate and a semiconductor layer, a mesa, a light emitting layer, and an electrical contact. The μLEDs in this device may have improved EE because of their shape. Light is generated within the mesa, which is shaped to enhance the escape probability of the light. In particular, improved EEs may be achieved with a near parabolic mesa that has a high aspect ratio. The top of the mesa is truncated above the light-emitted layer (LEL), providing a flat surface for the electronic contact on the top of the semiconductor mesa. It has been found that the efficiency is improved, provided the top contact has a good reflectivity value.

The result of this structure is that the μLED output light is quasi-collimated, making the μLED a type of semiconductor light source that can be positioned somewhere between a Laser (where the light is coherent and directional) and a standard LED (where the light is scattered in all directions). These μLED devices allow for quasi collimated beams to be produced with a focus of, for example, less than 30°. This can be compared to standard unfocussed LEDs which produce beam angles in excess of 100°. The key benefits of being able to focus LED light is that less light is wasted because it is possible to get most or all the light generated by the LED into the space where it is needed, i.e. virtually all of the light generated is used, and little or none is wasted. This potentially results less power used by LED devices, which can lead to longer battery life in battery powered LED devices, and easier miniaturisation of devices as the light can be directed to where it is needed with the use of additional complicated optics.

LED arrays have a number of applications including LED printing, heads-up displays, active matrix displays systems and signage, amongst others. They are distinct from standard LEDs in their ability to allow for individual emitters be controlled and switched independently. For wide format printing it may be required to provide a linear array light source of say 35 cm or more wide, which are typically made up of a number of linear array modules. The linear array modules may be about 0.2 mm to 20 mm long and are abutted to form a longer linear array.

Modular LED arrays are disclosed, for example, in U.S. Pat. No. 6,683,421.

A problem encountered with available LED arrays, is that an array of individual LEDs on a chip may be closely spaced, but because of the packaging and housing surrounding such an array of LEDs, when two arrays (or chips) are abutted, the spacing between adjacent LEDs on the abutted chips can be quite large, much larger than the spacing between LEDs on the same chip. Similarly, high density square may use 5×5 diode arrays. These arrays may be arranged in groups to provide larger area high intensity arrays, for example as described in the above-mentioned U.S. Pat. No. 6,683,421. In another example, multiple LED arrays may be linearly arranged to provide a wide band of illumination.

In a typical square 5×5 LED array, for example, each LED die may be 1 mm$^2$, so that the array may be about 7 mm×7 mm. However, the arrays are fabricated on a substrate, which has a 1 mm to 2 mm edge that surrounds each individual LED die. The die may be hermetically sealed within the package, which requires a minimum wall thickness around the LEDs to provide a good seal. When these LED arrays are abutted, there is a gap or spacing between adjacent groups of LEDs, which may be 2 mm to 4 mm. Thus, there is a limit on the pitch between LEDs on the arrays to maintain the pitch across neighbouring arrays due to packaging constraints. This can mean that there is uniform intensity along the length or width of the each module, but there is a dip in intensity/irradiance in the region where each module abuts, which tends to cause a banding effect in the substrate being cured.

U.S. Pat. No. 6,450,664 shows a modular LED array assembly, which provides a denser arrangement of LEDs near ends of the assembly to provide a uniform irradiance profile with a sharper edge, i.e. approaching a rectangular or "top hat" function. U.S. Pat. No. 6,380,962 to Miyazaki provides an arrangement to provide an irradiance profile with a sharper edge using wider light source near ends of a linear light source. However, the problem of providing a more uniform irradiance profile where two modules abut is not addressed. In fact a sharp profile may exacerbate edge effects in modular arrays, i.e. creating a more marked discontinuity or dip in irradiance caused by the spacing where two modules abut, depending on the size of the gap or separation between LED elements due to the mechanical housing.

In another example, disclosed in U.S. Pat. No. 7,175,712, LEDs are arranged in staggered rows, and LED arrays are also staggered to provide a more uniform irradiance. However, because of the thickness of the substrate and packaging surrounding the array, this arrangement also does not overcome a discontinuity in irradiance around edges of the arrays, or where two arrays abut.

U.S. Pat. No. 6,515,309 presents a method where grooves are cut below the top surface of the LED material such that a neighbouring chip may be closely aligned and packaging issues due to chipping are reduced. In U.S. Pat. No. 6,515,309, the angled cuts are formed between the plane of the light emitting layer and the bottom of the chip (ie from top to bottom).

WO 2010130051 provides a method for fabricating monolithic LED arrays with high resolution. It aims to replicate an addressable array of LED emitters that is continuous, i.e. contains no dark area. It is not possible simply to contact the individual emitters due to constraints on the interconnects. In WO 2101130051, a constant array is replicated using two rows of emitters that are offset. This results in two complimentary rows which alternate between an emitting and a non-emitting area of the same size. In order to provide a constant line of light (i.e. a ID array), the emitters are moved and timing of LED illumination is controlled. WO 2101130051 also outlines a control scheme and optical arrangement for use with the above arrays.

Arrays fabricated on individual standard LED chips cannot, in general, reach resolutions less than 200 µm. This is due to the limit on the size of the individual chips. Therefore to produce LED arrays of high density/resolution, monolithic array chips must be used. A similar problem of packing density and intensity occurs for monolithic arrays. Although the emitters can be very closely packaged when on the same chip, when multiple chips are abutted to form longer arrays the packaging density is reduced.

With available LED arrays, for high speed printing applications using very short exposure times of the substrate to be cured, an array formed from individually packaged LED die, or a single row of LED die, may not provide sufficient intensity or resolution. It is then necessary to provide a higher density array of emitters to provide a line, a band, multiple lines, or multiple bands of illumination of higher intensity. Therefore, higher density arrays allow for faster printing or photo-curing and higher resolution printing as well as enabling a number of new applications.

SUMMARY

The inventors have identified a need for a modular LED array, which provides uniform irradiance over a large area, and avoids problems with a discontinuity in irradiance when two or more LED modules are abutted. Furthermore, the inventors have identified a need for an LED array which provides a continuous illumination source without the discontinuities which can occur when chips are abutted to form a longer array. Apparatus and methods disclosed herein allow for monolithic array chips to be abutted to form longer arrays without any loss of emitter density or resolution.

Disclosed herein is a chip design that allows for enhanced packaging between individual chips. The inventors have appreciated that, in general, the distance between individual emitters must remain consistent across a full array, whether or not it includes multiple chips. Therefore in known arrays that contain multiple chips, the maximum resolution is dictated by the packaging constraints.

According to an aspect of the present disclosure, there is provided an LED chip for use in an LED chip array forming a continuous array of LEDs. The LED chip comprises an array of LEDs on a substrate. LEDs in a row of the array are longitudinally offset from corresponding LEDs in another row. Adjacent LEDs in each row of the array are separated by a longitudinal pitch. At least part of an end face of the substrate is angled with respect to a transverse axis of the LED chip such that the LED chip is positionable adjacent another LED chip to maintain the longitudinal pitch between adjacent LEDs on different chips.

The term "longitudinal" is used herein to define an axis of an LED chip and the term "transverse" is used herein to define another axis of an LED chip that is orthogonal to the longitudinal axis. However, it is noted that the terms are used only to make the description of the LED chip clearer and do not limit the relative dimensions of the LED chip. That is, the longitudinal axis need not define the longest axis of the LED chip. Further, the LED chip is not required to be elongate.

It is noted that the end face of the substrate is angled with respect to the transverse axis. The end face may be substantially perpendicular to a top surface (i.e. a surface on which the LEDs are formed) and a bottom surface of the substrate. That is, the angled end face may produce a chamfered corner of the substrate when viewed from the top or bottom. The angular dice may be from one side to the other of the LED chip.

As used herein, the term "corresponding LED" encompasses LEDs of an array that would, under normal square or rectangular array conditions, be in different rows but the same column. That is, in a square array, corresponding LEDs may be defined by a single column. It is noted that the terms "column" and "row" when referring to an array imply no limitation on the dimensions or orientation of an array and are used for descriptive purposes only.

Optionally, the LEDs are arranged in a quasi 1-D array. A quasi 1-D array may comprise a plurality of LEDs in which the longitudinal offset between corresponding LEDs is equal to the diameter of each LED.

Optionally, the LEDs comprise at least one µLED. The term "µLED" as used herein encompasses an LED emitter with a diameter in the range from 1 µm to 50 µm in diameter. A µLED may be a bottom emitter with light escaping through a bottom surface of the device. A µLED may include a reflective dome such that light is extracted with high efficiencies and in a controlled beam. Further definition of a µLED may be found in U.S. Pat. No. 7,518,149.

Optionally, the angle of the at least part of the end face is based on the longitudinal offset between corresponding LEDs in different rows of the array and a transverse pitch between rows of the array.

Optionally, the at least part of the end face of the substrate is substantially parallel to a line taken between corresponding LEDs in different rows of the array.

Optionally, at least part of an opposite end face of the substrate is also angled with respect to the transverse axis.

Optionally, the at least part of the end faces of the substrate are parallel.

Optionally, the substrate forms a parallelogram.

Optionally, each LED is a sufficient distance from an edge of the substrate such that light emitted from the LED does not substantially escape from the edge of the substrate. For example, each LED may be positioned a sufficient distance from the edge of the substrate such that the light escaping from the edge of the substrate is in a range from 0% to 50, in a range from 0% to 20, in a range from 0% to 10%, or in a range from 0% to 5%.

Optionally, each LED is at least 5 μm from the edge of the substrate. Optionally, each LED may be at least 10 μm from the edge of the substrate.

Optionally, the angle of the end face of the substrate relative to the transverse axis is in the range from 30 degrees to 85 degrees.

According to the present disclosure in a second aspect, there is provided an array of LED chips as defined above. At least one LED chip is positioned adjacent another LED chip such that a longitudinal pitch between adjacent LEDs on different chips is substantially the same as the longitudinal pitch between adjacent LEDs on each chip.

Optionally, a gap is defined between the adjacent chips.

According to the present disclosure in a third aspect, there is provided a method of manufacturing an LED chip. The method comprises fabricating an array of LEDs on a wafer substrate. LEDs in a row of the array are longitudinally offset from corresponding LEDs in another row, and adjacent LEDs in each row of the array are separated by a longitudinal pitch. The method further comprises dicing the wafer substrate such that at least part of an end face of the substrate is angled with respect to a transverse axis of the LED chip such that the LED chip is positionable adjacent another LED chip to maintain the longitudinal pitch between adjacent LEDs on different chips.

BRIEF DESCRIPTION OF THE DRAWINGS

Exemplary implementations of the present disclosure are described herein with reference to the accompanying drawings, in which.

DETAILED DESCRIPTION

Figure 1A:
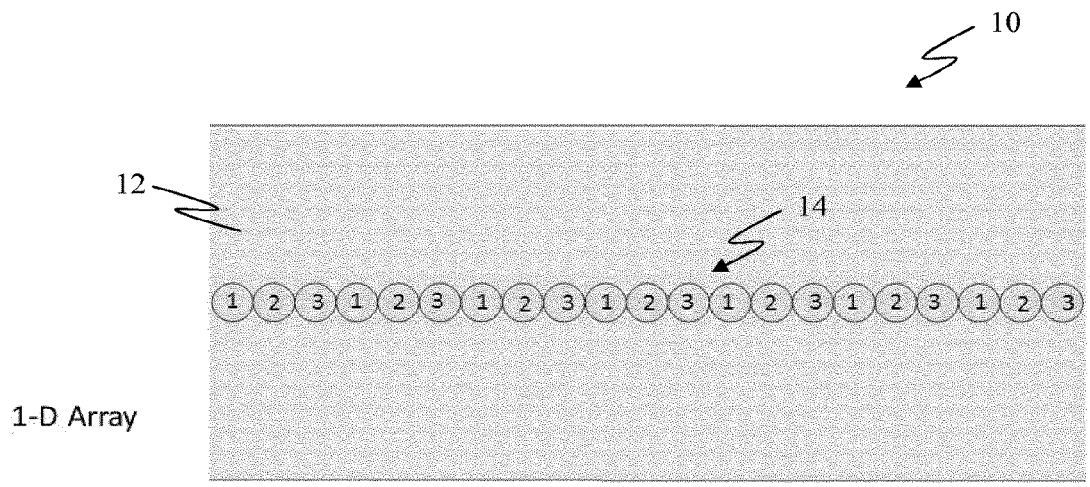
FIG. 1a is a schematic representation of a 1-D array of LEDs on an LED chip.

Generally disclosed herein are apparatus and methods to allow LED chips to be positioned adjacent one another to form a continuous array of LEDs while maintaining a constant pitch between individual LEDs.

LED arrays on an LED chip may comprise one or more of: 1) Discrete LED components (e.g. TO can, surface mount or epoxy packages) densely packed in a row on a PCB; 2) Bare die LED chips densely packed in a row (i.e. using Chip on Board (COB) or other approaches); and 3) Multiple individually addressable LEDs on a single chip (i.e. a monolithic LED array).

For the first two examples above, a full LED chip produces light and each LED device in an array may be considered a single emitter. Therefore, the size of the LEDs and the pitch of such LEDs in an array (and hence the resolution) is defined by the size and packaging density of the individual components. For example, if a standard bare die LED chip with dimensions of 250 μm×250 μm is used and requires a spacing of 200 μm interconnections, then the pixel size of an array so formed is limited to 250 μm and the pitch is limited to 200 um.

The production of individual LEDs of very small dimensions (say 100 μm or less) leads to significant problems with handling and interconnection of such chips. Therefore to produce arrays with LEDs of very small sizes it is required that array chips are formed. These are typically termed monolithic chips that have a number of areas that may or may not produce light. These allow for simpler handling and interconnection while enabling a small size of LED and pitch between LEDs.

For the production of long arrays of this type, a single continuous piece of LED material is required. The length of such monolithic arrays is limited to approximately 200 mm due to the maximum diameter of an LED starter wafer. In practice, the maximum length of such arrays that can be fabricated is far smaller than this due to manufacturing tolerances and cost implications. In addition a single failed emitter on such a monolithic chip would result in the whole array being discarded. This has serious implications for yield and cost of manufacturing.

To overcome these challenges and allow for long LED arrays in a cost effective manner a number of smaller monolithic LED array chips may be formed and packaged together to form a continuous LED array. In order to maintain a constant pitch between all LEDs in the continuous array, it is necessary to place adjacent chips as close together as possible so that the pitch between edge LEDs on two abutted chips is the same as the pitch between the emitters on the chips.

Put another way, for the reasons given above, it is desirable that the pitch is constant between all LEDs in an LED array. This may be achieved fairly easily on a single chip. However, where longer arrays of LEDs are required, a plurality of LED chips, each comprising an array of LEDs, must be placed together to form a continuous array. In such cases, the pitch between the LEDs in the continuous array is limited to the minimum pitch that can be obtained between LEDs at the edges of adjacent LED array chips. Because of packaging constraints, the pitch between the LEDs at the edges of adjacent chips is required to be larger than is desired and unduly limits the pitch between all LEDs in the continuous array.

Figure 1B:
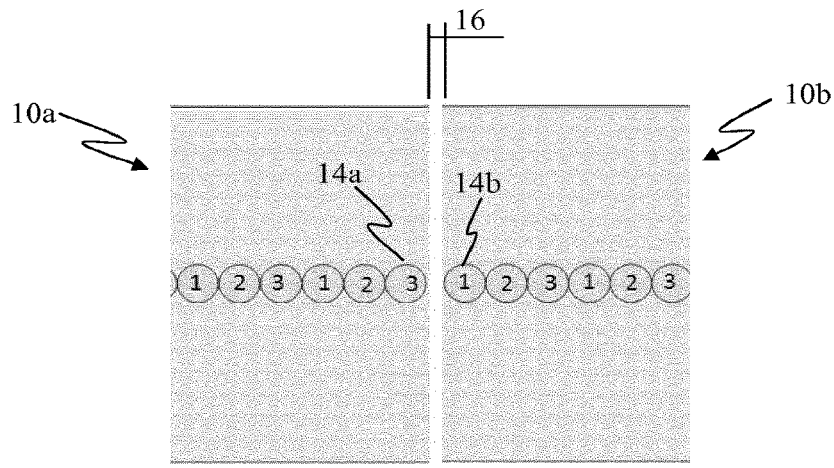
FIG. 1b is a schematic representation of two LED array chips positioned adjacent one another.

This is demonstrated with reference to FIGS. 1a and 1b. FIG. 1a shows an LED chip 10 comprising a substrate 12 and a 1-D array of LEDs 14 formed on the substrate. The LEDs in the array 14 are shown to be very tightly packed together and, in fact, the edges of each LED are touching the edges of each adjacent LED. Such arrays have applications in printing, heads-up displays, active matrix displays systems and signage, as described above.

Referring to FIG. 1b, an enlarged view of a first LED array chip 10a positioned adjacent to a second LED array chip 10b is shown. In practical applications, there is always an amount of substrate that remains to the side of the edge LEDs 14a and 14b, such that they are not quite touching the edge of the substrate. Further, when the chips 10a, 10b are placed together, a gap 16 is left in order to properly align the chips. Although in FIG. 1b the edge of the substrate is shown as a neat and straight line, typically, the cut edge of the substrate may be jagged and uneven or not completely flush. Therefore, if the chips 10a, 10b are abutted, there may be some misalignment of the chips 10a, 10b, which may result in misalignment of the continuous array. As a result of the gap 16, the pitch between the edge LED 14a and the edge LED 14b is not the same as the pitch between the LEDs on the chips 10a, 10b. This can result in discontinuity of irradiance, as explained above The apparatus and methods disclosed herein may be used with 1-D LED arrays. As such, this description focuses on 1-D arrays and, more specifically, quasi 1-D arrays (discussed below). However, it is noted that the principles disclosed herein may be applied to multi-dimensional arrays.

Figure 2:
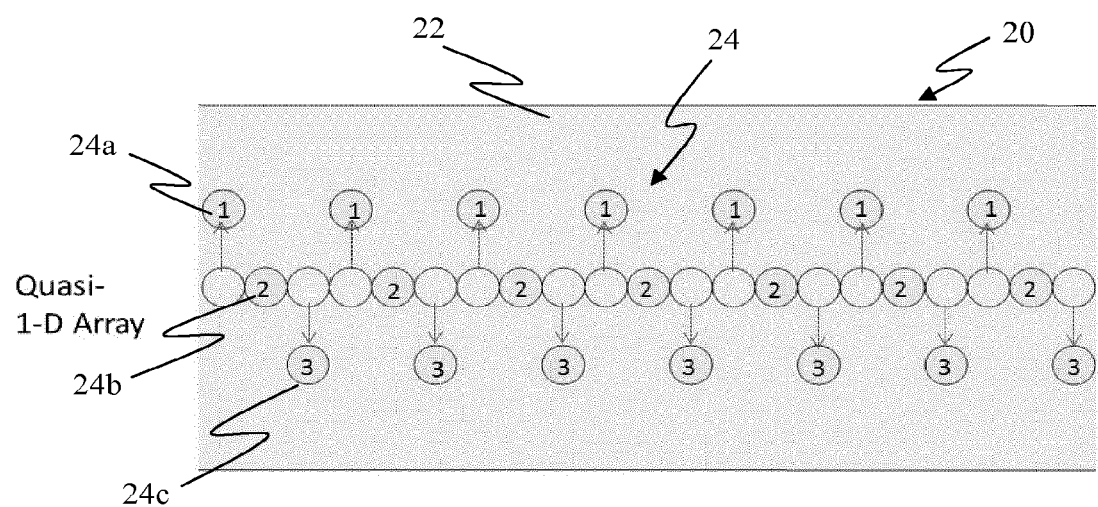
FIG. 2 is a schematic representation of a quasi 1-D array.

Particular apparatus disclosed herein may comprise a quasi 1-D array of LEDs. A quasi 1-D array is described below with reference to FIG. 2. A quasi 1-D LED array chip 20 comprises a substrate 22 and a plurality of LEDs 24 formed on the substrate. The LEDs 24 are arranged in an array in which corresponding LEDs in different rows of the array are longitudinally offset. The LEDs 24a, 24b and 24c are corresponding as, if the array were square or rectangular, those LEDs would form a single column. That is, LEDs 24a, 24b, 24c are considered to be corresponding and each of them is longitudinally offset from the other. The longitudinal offset between LED 24a and LED 24b is the same as the longitudinal offset between LED 24b and LED 24c. In the case of FIG. 2, the array is slanted to form a parallelogram.

In practice, for quasi 1-D array chips the LEDs on a monolithic chip are offset in both directions to allow for simplification of the packaging and interconnection of the chips. This is shown in FIG. 2 by the empty circles, which show the position of an LED in a true 1-D array and the arrows, which show the offset of an LED. This is undertaken due to space requirements for contacting the emitters on the monolithic chips. In use, the quasi 1-D array chip is moved across a surface to be illuminated and the sequence of switching on the offset LEDs allows for the formation of a quasi 1-D array.

Apparatus and methods disclosed herein provide for dicing chips from a wafer in such a way that the pitch between LED emitters in an offset row on neighbouring chips is maintained. The approach is also suitable for the manufacture of 2D arrays with less wasted material and hence at lower cost.

Cuts in two directions are required to release LED chips from a wafer. For standard applications, the cuts are at 90° to each other and the chip so formed is a square or a rectangle. In apparatus and methods disclosed herein, the cuts are not at 90° to each other. The shape formed by such a chip may be a parallelogram. In the specific example of a quasi 1-D array chip, the angle of the cut is defined by the size, pitch and displacement of the quasi 1-D array. In specific LED chips, the angle of the cut is parallel to a line between corresponding LEDs of the quasi 1-D array.

Figure 3A:
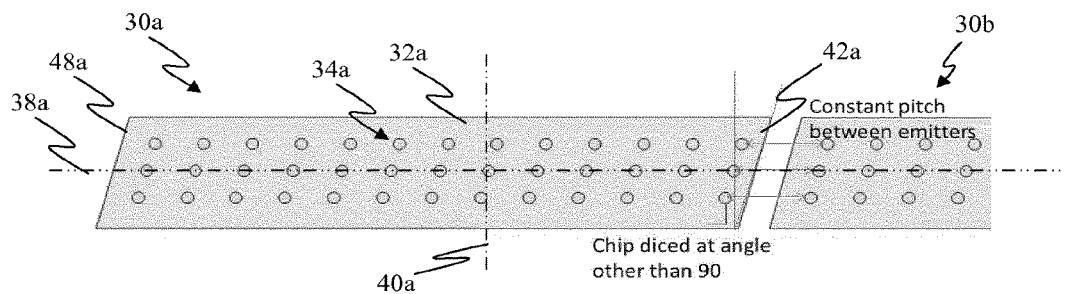
FIG. 3a is a schematic representation of two LED chips positioned adjacent one another.
Figure 3B:
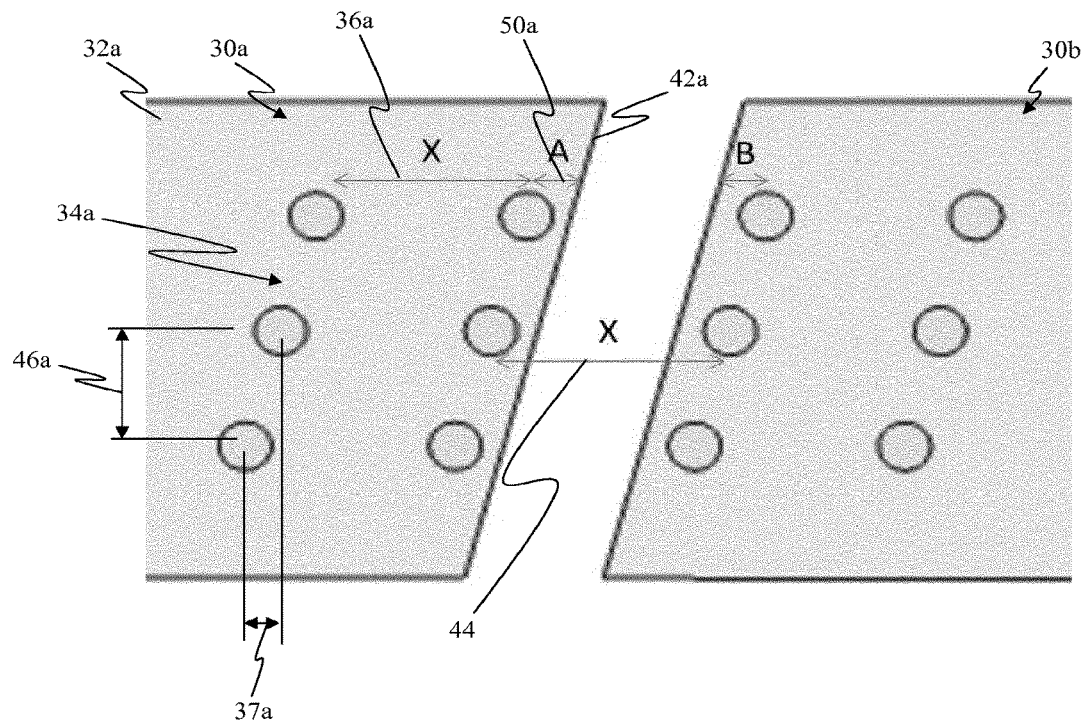
FIG. 3b is an enlarged view of schematic representation of two LED chips positioned adjacent one another.

Referring to FIGS. 3a and 3b, an LED chip 30a is shown that is suitable for positioning adjacent to another LED chip 30b to form a continuous array of LEDs. The LED chip 30a comprises a substrate 32a having an array of LEDs 34a formed thereon. In the exemplary chip 30a of FIGS. 3a and 3b, the array of LEDs 34a has three rows and thirteen columns. It will be appreciated that other configurations of rows and columns may be used. The LEDs in a row have a longitudinal pitch 36a between them. The longitudinal pitch is the distance from the centre of one LED to the centre of an adjacent LED in the same row. In addition, corresponding LEDs in adjacent rows are longitudinally offset 37a, as described above. The longitudinal offset is the distance from the centre of one LED to the centre of a corresponding LED in an adjacent row.

In exemplary LED chips, the diameter of the LEDs may be in the range from 1 µm to 50 µm or, in a specific exemplary LED chip, 20 µm. Such LEDs may be termed µLEDs.

In the exemplary LED chip shown in FIGS. 3a and 3b, the array of LEDs are arranged in a quasi-1D array, as described above. In such arrangements, the longitudinal pitch 36a may be equivalent to a multiple of the diameter of the LEDs in the array. Specifically, the longitudinal pitch 36a may be equal to the diameter of the LEDs in the array multiplied by the number of rows in the array minus one. That is, if the diameter of the LEDs is 20 µm and there are three rows in the LED array, the longitudinal pitch may be 40 µm. The longitudinal offset 37a may be equal to the diameter of the LEDs in the LED array.

A longitudinal axis 38a and a transverse axis 40a are shown in FIG. 3a for descriptive purposes only and do not imply any limitation on the shape of the LED chip 30a.

An end face 42a of the substrate 32a is angled with respect to the transverse axis 40a. This allows the LED chip 30a to be positioned adjacent an LED chip 30b in such a way that the longitudinal pitch 44 between the LEDs on different chips is maintained. That is, the longitudinal pitch 44 is substantially the same as the longitudinal pitch 36a. In exemplary LED chips, the angle of the end face 42a of the substrate relative to the transverse axis 40a may be in the range from 30 degrees to 85 degrees, or in the range from 70 degrees to 85 degrees, or in the range from 73 degrees to 79 degrees.

It is noted that the end face of the substrate is angled with respect to the transverse axis. The end face may be substantially perpendicular to a top surface (i.e. a surface on which the LEDs are formed) and a bottom surface of the substrate. That is, the angled end face may produce a chamfered corner of the substrate when viewed from the top or bottom. The angular dice may be from one side to the other of the LED chip.

The end face 42a may be any edge of the LED chip that is for positioning adjacent a corresponding edge face of another LED chip in an array of LED chips.

Because the end face 42a of the LED chip 30a is angled and the corresponding end face of the LED chip 30b is also angled with respect to the transverse axis, the longitudinal pitch 44 between the edge LEDs of the chips 30a, 30b may be made the same as the longitudinal pitch 36a between the LEDs on a chip 30a, 30b without the need to abut the adjacent chips 30a, 30b. A significant gap may be left between the chips 30a, 30b. This gap allows an amount of tolerance when placing the chips 30a, 30b adjacent one another.

In specific exemplary LED chips, the LEDs of the LED array 34a comprise at least one µLED. In exemplary LED chips, the LEDs may comprise a cluster of a plurality of µLEDs. In a specific LED chip, the LEDs are µLEDs, as described in U.S. Pat. No. 7,518,149.

The angle of the end face 42a relative to the transverse axis 40a is, in one exemplary LED chip, determined based on the longitudinal offset 37a between the corresponding LEDs of the array and a transverse pitch 46a between the rows of the LED array 34a. In one specific LED chip, the end face 42a of the substrate 32a is parallel to a line drawn between two corresponding LEDs in the LED array 34a. One way of calculating the angle of the end face 42a relative to the transverse axis 40a is by determining the inverse tangent of the transverse pitch 46a divided by the longitudinal offset 37a ($\tan^{-1}$(transversePitch/longitudinalOffset)).

As shown in FIG. 3a, an opposite end face 48a to the end face 42a may also be angled relative to the transverse axis 40a. In specific LED chips, the opposite end face 48a may be parallel to the end face 42a. In such LED chips 30a, the substrate may be shaped substantially like a parallelogram.

In addition, an amount of substrate 50a is left between the edge LEDs and the end face 42a of the substrate 32a. This is possible due to the tolerance available when placing LED chips 30a, 30b adjacent each other as a result of the angled end face 42a. The tolerance may be used to ensure that every LED is at least a given distance from the edge of the substrate 32a, which reduces loss of light emitted from an LED through the sides of the substrate. A similar section of substrate may also be seen on LED chip 30b.

Figure 4:
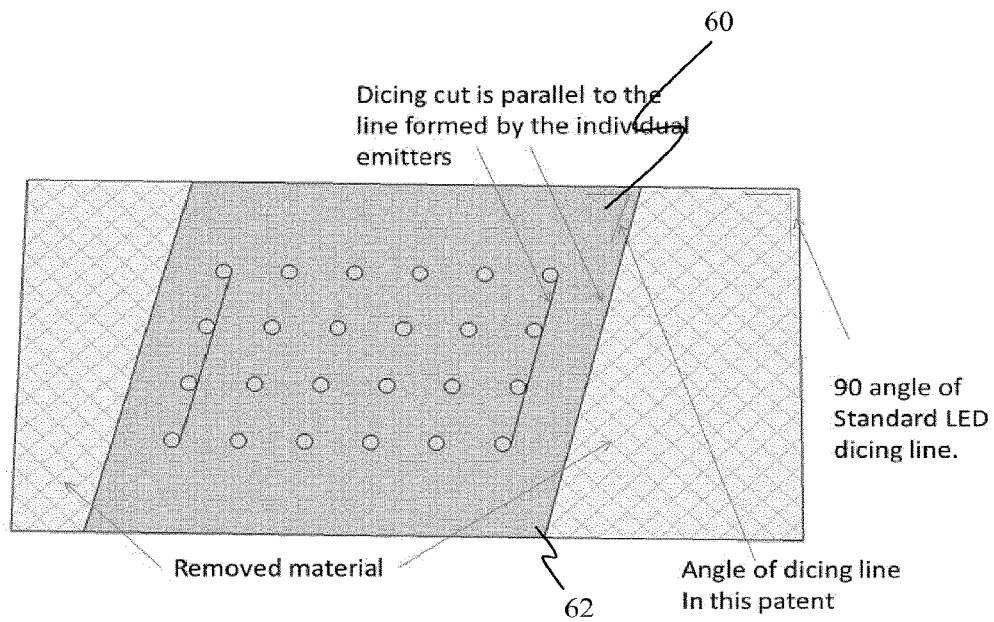
FIG. 4 is a schematic representation showing the angle of dicing of an LED chip.
Figure 5:
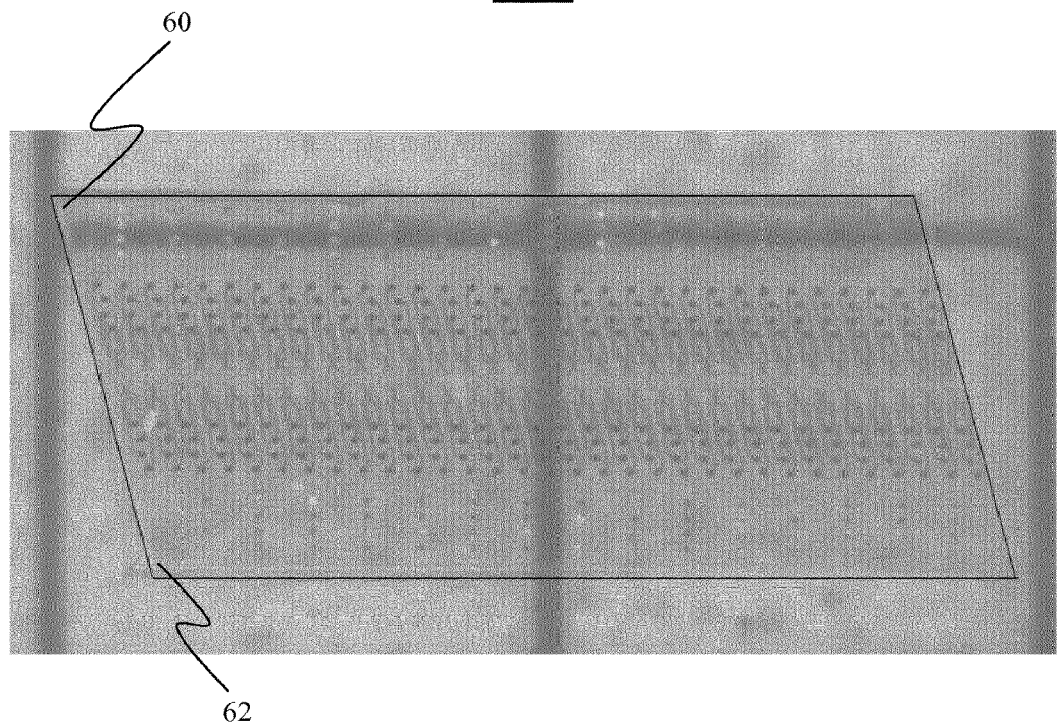
FIG. 5 is a photograph of an LED chip.

FIGS. 4 and 5 show an LED chip diced at an angle 60 of 76° relative to the transverse axis, or a typical orthogonal dicing line. The consecutive angle 62 is 104° (i.e. 180°-76°). The angle of dicing of the chip is dependent on the arrangement of the LEDs in the LED array, as explained above. This, in turn, allows for the pitch between LEDs on neighbouring chips to remain regular across an entire continuous LED array comprising a plurality of LED chips.

In exemplary LED chips, the LEDs have a diameter in the range from 15 µm to 25 µm, or in specific LED chips, 20 µm. The longitudinal offset between corresponding LEDs in an LED array may be equal to the diameter of the LEDs, which may be 20 µm. In this way, the LEDs are aligned in the longitudinal axis to be one after the other with no space between. The transverse pitch between LEDs in adjacent rows of the LED array may be in the range from 10 um to 500 um, in the range from 70 µm to 90 µm or, in a specific LED chip, 80 µm. This results in a dicing angle of approximately 76°.

This present disclosure allows for the fabrication of large arrays through the packaging together of smaller array chips. In an array the failure of a single pixel results in an un-useable chip. The effect of this on large chips is very wasteful. Therefore the approach of using smaller chips as building blocks for larger arrays allows for increased yields. It also allows for more economical positioning of chips on a wafer and the fabrication of arrays longer than the current diameter of a state-of-the-art GaN (visible LED) wafer-150 mm.

As demonstrated by FIGS. 3a and 3b, an array of LED chips as described herein may be manufactured. At least one LED chip 30a is positioned adjacent another LED chip 30b such that a longitudinal pitch 44 between adjacent LEDs on different chips is substantially the same as the longitudinal pitch 36a between adjacent LEDs on each chip. In specific LED arrays, a gap is defined between the adjacent chips.

Traditional LED manufacturing technique involve the creation of discrete chips assembled into larger arrays on a wafer with pre-determined dicing lines or "streets" already present, which determine where the wafer will be diced. This in turn requires that the wafers be re-designed and manufactured specifically for each application or product. The dicing concept disclosed herein could be applied across any point on a wafer. This means that the manufactured wafer can contain a large number of discrete LEDs (effectively pixels) without pre-determined dicing lines and that the wafer can be diced at any location. This creates the flexibility to generate different sized array chips from a common wafer layout, thereby simplifying manufacturing processes.

Furthermore, having the LEDs placed closer to the edge of the dicing location can also confer benefits. Closer placement of the LED to the edge of the chips reduces the size of unused wafer at the edge of the die and thereby allows more tolerance between the chips during final assembly, as shown in FIG. 3a. For example, if the LEDs are placed 100 microns apart on the wafer and a 50 micron dicing saw is used during the dicing stage, then the individual chips can allow a 50 micron gap between adjacent chips during the placement procedure, while still maintaining an overall 100 micron spacing between LEDs on adjacent chips. This 50 micron gap provides for higher tolerances during the assembly portion of the manufacturing process. With laser dicing this can be reduced to small gaps, while still maintaining adequate tolerances for industrial chips placement.

Disclosed herein is an LED chip which is not square or rectangle in shape. The LED chip may have angles formed by its corners of 90 degrees+/−5 deg. The LED chip as may allow for the formation of an array of chips such that adjacent emitters on neighbouring chips are equidistant to adjacent emitters contained within a single chip. An LED array comprising individual chips packaged together, wherein the individual chips are diced at an angle other than 90°. The LED may comprise individual LED emitters arranged in a quasi ID layout. The LED chip may have an angle of dicing parallel to the line formed by the emitters adjacent to the edge. The LED array chip may comprise a quasi-ID array that is unaffected by packaging constraints. The LED array may comprise LED chips as disclosed above which provide a continuous and uniform illumination source along the length of the array. The LED device may comprise individual emitters LEDs are µLEDs. The array of LEDs may be on a wafer wherein there are no pre-determined dicing lines and the wafer may be diced at any point using a dicing angle other than 90° to give an array of any size. The array of LEDs may be on a wafer wherein there are pre-determined dicing lines with the pitch between the neighbouring emitters being smaller than the normal pitch, thereby facilitating more tolerance in the placement of abutting chips.

Figure 6:
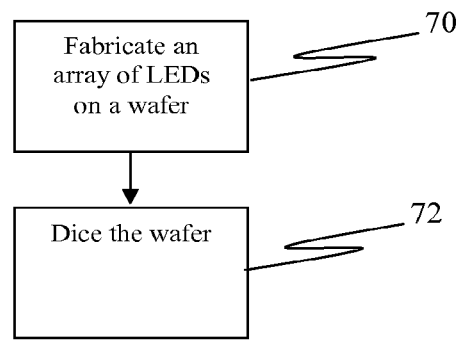
FIG. 6 is a flow diagram showing a method of manufacturing an LED chip.

There is also disclosed a method of manufacturing an LED chip, as shown in FIG. 6. The method comprises fabricating an array of LEDs on a wafer substrate 70. The LEDs in a row of the array are longitudinally offset from corresponding LEDs in another row, as explained in detail above. Further, adjacent LEDs in each row of the array are separated by a longitudinal pitch, as explained in detail above. The method further comprises dicing the wafer substrate 72 such that at least part of an end face of the substrate is angled with respect to a transverse axis of the LED chip, as explained in detail above. This allows the LED chip to be positionable adjacent another LED chip to maintain the longitudinal pitch between adjacent LEDs on different chips.

The skilled person will be able to envisage other methods and apparatus without departing from the scope of the appended claims.

What is claimed is:

1. An electronic display device, comprising:
   a light emitting diode (LED) chip, including:
      a substrate; and
      an array of LEDs on the substrate arranged in a plurality of rows along a longitudinal direction of the substrate, adjacent LEDs in a row of the array longitudinally offset by a longitudinal pitch that corresponds to multiples of a diameter of an LED in the row, LEDs in the row longitudinally offset from LEDs in an adjacent row of LEDs.

2. The electronic display device of claim 1, wherein each of the LEDs has a diameter between 1 µm and 50 µm.

3. The electronic display device of claim 1, wherein adjacent LEDs in all rows of the array of LEDs are offset by the same longitudinal pitch.

4. The electronic display device of claim 1, wherein the substrate includes a first end face, at least a part of the first end face extending at a non-orthogonal angle relative to a longitudinal direction of the substrate, and the at least a part of the first end face being substantially parallel to a line taken between corresponding LEDs in different rows of the array of LEDs.

5. The electronic display device of claim 1, wherein the substrate does not include a predetermined dicing line.

6. The electronic display device of claim 1, further comprising another LED chip, and wherein the LED chip is placed adjacent to the other LED chip such that an LED on the LED chip and another LED on the other LED chip are separated by the longitudinal pitch.

7. The electronic display device of claim 6, wherein the LED chip and the other LED chip are separated by a gap.

8. The electronic display device of claim 1, wherein each LED is at least 5 µm from an edge of the substrate.

9. The electronic display device of claim 1, wherein each of the LEDs includes:
a mesa having a parabolic shape with a truncated top; and
a light emitting layer in the mesa.

10. A method of manufacturing an electronic display device, comprising:
forming a light emitting diode (LED) chip including an array of LEDs on a substrate arranged in a plurality of rows extending along a longitudinal direction of the substrate so that adjacent LEDs in a row of the array are longitudinally offset by a longitudinal pitch that corresponds to multiples of a diameter of an LED in the row and LEDs in the row longitudinally offset from LEDs in an adjacent row of LEDs.

11. The method of claim 10, further comprising dicing the substrate formed with the array of LEDs so that at least a part of a first end face of the substrate extends at a non-orthogonal angle relative to the longitudinal direction of the substrate and the at least a part of the first end face is substantially parallel to a line taken between corresponding LEDs in different rows of the array of LEDs.

12. The method of claim 11, wherein the substrate is diced so that at least part of a second end face at an opposite side of the first end face of the substrate extends parallel to the at least part of the first end face.

13. The method of claim 10, wherein each of the LEDs has a diameter between 1 µm and 50 µm.

14. The method of claim 10, wherein the array of LEDs is arranged into a quasi-1D array.

15. The method of claim 10, wherein adjacent LEDs in all rows of the array of LEDs are offset by the same longitudinal pitch.

16. The method of claim 10, wherein the substrate does not include a predetermined dicing line.

17. The method of claim 10, wherein each LED is at least 5 µm from an edge of the substrate.

18. The method of claim 10, wherein each of the LEDs includes:
a mesa having a parabolic shape with a truncated top; and
a light emitting layer in the mesa.

19. The method of claim 10, further comprising placing the LED chip adjacent to another LED chip such that adjacent LEDs on the LED chip and the other LED are separated by the longitudinal pitch.

20. The method of claim 19, wherein the LED chip and the other LED chip are placed so that a gap is present between the LED chip and the other LED chip.

* * * * *